US006831282B2

(12) United States Patent
Yahiro

(10) Patent No.: US 6,831,282 B2
(45) Date of Patent: Dec. 14, 2004

(54) METHODS AND DEVICES FOR EVALUATING BEAM BLUR IN A CHARGED-PARTICLE-BEAM MICROLITHOGRAPHY APPARATUS

(75) Inventor: Takehisa Yahiro, Kamagaya (JP)

(73) Assignee: Nikon Corporation, Tokyo (JP)

( * ) Notice: Subject to any disclaimer, the term of this patent is extended or adjusted under 35 U.S.C. 154(b) by 80 days.

(21) Appl. No.: 10/000,458

(22) Filed: Nov. 30, 2001

(65) Prior Publication Data

US 2002/0113214 A1 Aug. 22, 2002

(30) Foreign Application Priority Data

Feb. 9, 2001 (JP) ........................................ 2001-033970
Feb. 20, 2001 (JP) ........................................ 2001-043195

(51) Int. Cl.$^7$ ............................ G21K 5/00; G01N 23/00; H01J 37/00
(52) U.S. Cl. ........................ 250/492.22; 250/492.2; 250/492.23; 250/492.3; 250/396 R; 250/398; 250/397; 250/491.1; 250/310
(58) Field of Search ........................ 250/310, 396 R, 250/397, 398, 423 R, 423 F, 491.1, 492.2, 492.22, 492.23, 492.3; 430/296

(56) References Cited

U.S. PATENT DOCUMENTS

| 5,396,077 A | | 3/1995 | Sohda et al. | |
| 5,633,507 A | * | 5/1997 | Pfeiffer et al. | 250/492.23 |
| 5,939,725 A | * | 8/1999 | Muraki | 250/492.22 |
| 6,059,981 A | | 5/2000 | Nakasuji | |
| 6,352,799 B1 | * | 3/2002 | Nakasuji | 430/5 |
| 6,403,971 B1 | * | 6/2002 | Kawata | 250/491.1 |
| 6,441,384 B1 | * | 8/2002 | Kojima | 250/492.23 |
| 6,521,392 B2 | * | 2/2003 | Yahiro | 430/296 |
| 6,538,255 B1 | * | 3/2003 | Nakasuji | 250/492.23 |

FOREIGN PATENT DOCUMENTS

JP P2001-203149 A 7/2001

OTHER PUBLICATIONS

"New imaging and deflection concept for probe–forming microfabrication systems", by H.C. Pfeiffer, J. Vac. Sci, Technol., Vol 12, No. 8, Nov./Dec. 1975, pp. 1170–1173.

* cited by examiner

Primary Examiner—John R. Lee
Assistant Examiner—Mary El-Shammaa
(74) Attorney, Agent, or Firm—Klarquist Sparkman, LLP

(57) ABSTRACT

Methods and devices are disclosed for evaluating the imaging performance of a charged-particle-beam (CPB) micro lithography apparatus. A measurement mark is situated at an object plane, a knife-edged reference mark is situated at an image plane, and a beam-limiting diaphragm, defining a beam-limiting aperture, is situated downstream of the reference mark. The knife-edged reference mark is defined as a respective aperture in a scattering membrane. Passage of a charged particle beam through the measurement mark produces a beamlet that is scanned over the knife-edged reference mark. Charged particles of the beamlet passing through the reference mark are not scattered, while charged particles of the beamlet passing through the membrane are forward scattered. The diameter of the beam-limiting aperture can be established such that an axial angle of the beam-limiting aperture as measured at the knife-edge is slightly greater than a convergent angle of the beamlet at a projection lens. Consequently, the non-scattered charged particles pass through the beam-limiting aperture to a detector while most of the forward-scattered charged particles are blocked by the beam-limiting diaphragm.

23 Claims, 10 Drawing Sheets

METHODS AND DEVICES FOR EVALUATING BEAM BLUR IN A CHARGED-PARTICLE-BEAM MICROLITHOGRAPHY APPARATUS

FIELD

This disclosure pertains generally to microlithography performed using a charged particle beam such as an electron beam or ion beam. Microlithography is a key technology used extensively in the fabrication of microelectronic devices such as integrated circuits, displays, thin-film magnetic-pickup heads, and micromachines. In charged-particle-beam (CPB) microlithography the pattern to be transferred to a substrate is typically defined on a segmented reticle, i.e., a reticle that is divided into multiple exposure units (termed "subfields"). Each subfield defines a respective portion of the pattern and is exposed individually. More specifically, the disclosure pertains to, inter alia, methods and apparatus for evaluating the beam blur in a CPB microlithography system.

BACKGROUND

Conventional charged-particle-beam (CPB) microlithography methods (typically using an electron beam) suffer from the disadvantage of low throughput (i.e., number of production units such as wafers that can be processed per unit time). Substantial research and development is being directed to improving the throughput so as to provide a CPB microlithography technology that is practical for mass-production of microelectronic devices. For example, electron-beam "direct-drawing" techniques currently are used mainly for manufacturing reticles, and these techniques can be used for forming patterns directly on the surface of a suitable substrate. However, with direct-drawing methods, the pattern is formed on the substrate line-by-line or feature-by-feature, which requires enormous amounts of time per wafer. Hence, there are severe limits to the maximum throughput currently achievable using conventional electron-beam direct-drawing methods.

Various approaches to CPB microlithography have been considered in an effort to increase throughput. CPB-microlithographic exposure of an entire pattern (defined on a reticle) to the substrate in one exposure "shot," in the manner used in optical microlithography, would appear to be the best solution. However, this approach has to date been impossible for various reasons. One promising approach offering prospects of acceptable throughput is termed "divided-reticle" CPB microlithography, in which the pattern as defined on the reticle is divided into a large number of "subfields" each defining a respective portion of the pattern. Although each subfield defines only a portion of the pattern, the respective pattern portions are substantially larger than single features. Consequently, throughput is higher than with direct-drawing methods (but not as high as would be obtained if the entire reticle were exposed in one shot).

With the divided-reticle approach, achieving higher throughput principally involves configuring the subfields as large as possible so that the pattern portion projected with each respective shot is as large as possible. Increasing subfield size requires corresponding increases in the numerical aperture of the CPB optical system, which correspondingly increases the difficulty of correcting off-axis aberrations and beam blur. Hence, divided-reticle microlithography systems currently under development include respective subsystems for measuring aberrations and beam blur and for performing adjustments of the beam as required to correct the aberrations and beam blur. These adjustments typically include corrections of focal point, astigmatism, magnification, image rotation, and other parameters that impact the imaging performance of the system.

FIG. 13 is an oblique view schematically illustrating a conventional method for measuring beam blur; FIG. 14 depicts certain details of the method in schematic block form; and FIG. 15 is a plot of exemplary measurement results obtained using the method. This method for measuring beam blur is disclosed, for example, in Japan Kôkai Patent Document No. Hei 10-289851 (corresponding to U.S. Pat. No. 6,059,981) and in Japan Kôkai Patent Document No. 2001-203149.

Referring first to FIG. 13, it will be understood that an illumination-beam source and a reticle, although not shown, are located upstream of the components shown in the figure. The reticle, in addition to defining the pattern to be transferred to the substrate, also defines a pattern of measurement marks. The beamlet EB depicted in FIG. 13 is the small electron beam produced by transmission of the illumination beam through a measurement mark on the reticle. Hence, the beamlet EB that has passed through the measurement mark has a rectangular transverse profile. The measurement mark typically is rectangular in profile. The beamlet EB is incident on a plate 100 that defines a "knife-edged" reference mark 102. The reference mark 102 typically is rectangular in profile (the entire mark is not shown) and is configured as a respective through-hole defined by the plate 100 (see FIG. 14). The beamlet EB is incident in a scanning manner on a knife-edge 101 of the mark 102, wherein the knife-edge 101 is configured as in the well-known "knife-edge" test for evaluating the quality of an aerial image. An electron detector (sensor) 105 is disposed downstream of the mark 102.

As the beamlet EB is scanned in a direction indicated by a respective arrow (labeled "SCAN"; e.g., extending to the right in FIGS. 13 and 14), electrons of the beamlet EB incident on the plate 100 itself either are absorbed (if the plate 100 has sufficient thickness) or transmitted with forward-scattering (if the plate 100 is sufficiently thin). On the other hand, electrons incident on the reference mark 102 are transmitted through the reference mark and are detected by the electron detector 105. As noted above, if the plate 100 is sufficiently thin (e.g., made of silicon having a thickness of 2 $\mu$m), nearly all the electrons incident on the plate 100 are transmitted with forward-scattering through the plate. (Conventionally, configuring the plate 100 sufficiently thin so as to cause forward-scattering of incident electrons is preferred. Also, a thinner plate provides a greater geometric accuracy of the knife-edged reference mark 102.) In the following discussion, it is assumed that the plate 100 is sufficiently thin to cause forward-scattering.

In view of the above, the electrons detected by the electron detector 105 include non-scattered electrons e1 (that have passed directly through the reference mark 102) and electrons e2 (that were forward-scattered during transmission through the plate 100). The respective beam currents for the electrons e1 and e2, as detected by the detector 105, are amplified by a pre-amplifier 106, converted by a differentiation circuit 107 (wherein the conversion is to percent change versus time) to an output waveform, and displayed on an oscilloscope 108 or analogous display. Beam blur is determined from the output waveform produced by the differentiation circuit 107. From the determined beam blur, appropriate corrective adjustments (e.g., of focal point, astigmatism, magnification, rotation, etc.) are made to the beam. After making the corrective adjustments, another beam-blur measurement can be made to ascertain whether the corrective adjustments were appropriate.

In this conventional beam-blur measurement method, contrast of the "image" detected by the detector 105 is a function of the difference in electron scattering produced by the reference mark 102 versus the electron scattering produced by the plate 100. Unfortunately, most of the forward-scattered electrons e2 propagate to the detector 105. These detected forward-scattered electrons e2 reduce measurement contrast. Specifically, the forward-scattered electrons e2 are a source of measurement noise, as shown in FIG. 15. The noise produces an actual detected-current waveform W' that is offset from an ideal detected-current waveform W (based at the "0" level). Also, leading edges of the detected waveform have a gradual slope, which results in decreased measurement accuracy.

Modern divided-reticle CPB microlithography apparatus are configured to expose individual subfields measuring 250 μm square, for example, which is quite large. Simulation studies have revealed that beam blur over such an area exhibits a distribution in which the magnitude of blur is a function of location within the subfield. Simulation studies also have revealed that, whenever the current of an electron beam is increased so as to increase throughput, space-charge effects produce a distribution of beam blur within individual subfields. As a result, it is necessary to measure the distribution of beam blur with extremely high accuracy and precision. Such measurements simply are not obtainable using conventional methods, even in conventional methods in which beam blur is measured at a single point.

SUMMARY

In view of the deficiencies of conventional methods and devices as summarized above, the present invention provides, inter alia, methods and devices for evaluating imaging performance (specifically beam blur) of a charged-particle-beam (CPB) microlithography apparatus. The distribution of beam blur can be measured at high accuracy at one or more locations within a subfield.

A first aspect of the invention is set forth in the context of a CPB microlithography method. In the microlithography method a reticle, defining a pattern to be transferred to a sensitive substrate, is irradiated with a charged-particle illumination beam, and a charged-particle patterned beam, formed by passage of the illumination beam through an illuminated portion of the reticle and carrying an aerial image of the illuminated portion of the reticle, is projected onto a sensitive surface of a substrate. Thus, the sensitive surface is imprinted with the aerial image. In this context, methods are provided for evaluating the lithographic imaging performance. An embodiment of such a method comprises defining a beam-transmitting measurement mark at an object plane and defining a knife-edged reference mark, at an image plane, as a corresponding through-hole in a charged-particle-scattering membrane. The measurement mark is illuminated with a charged particle beam to form a charged-particle beamlet propagating downstream of the measurement mark toward the reference mark. The beamlet is projected onto the reference mark while scanning the beamlet over a knife-edge of the reference mark to produce non-scattered charged particles transmitted through the through-hole and forward-scattered charged particles transmitted through the membrane. The non-scattered and forward-scattered charged particles propagate downstream of the reference mark. A beam-limiting diaphragm is disposed downstream of the reference mark. The beam-limiting diaphragm comprises a diaphragm plate defining a beam-limiting aperture having a diameter sufficient to block most of the forward-scattered charged particles while not blocking the non-scattered charged particles from reaching the detector. The beam current of charged particles propagating downstream of the beam-limiting diaphragm is measured.

Because most of the beamlet passing through the membrane (defining the knife-edged reference mark) is blocked, substantially only the non-scattered charged particles of the beamlet passing through the reference mark are incident on the detector. By eliminating most of the forward-scattered charged particles, measurement noise is substantially reduced compared to conventional methods, without any adverse effect on measurement contrast. Furthermore, in situations in which a dummy beam is used to adjust beam current (to control space-charge effects), most of the forward-scattered charged particles from the dummy beam can be blocked from reaching the detector. This allows a good detection waveform to be obtained with nearly ideal contrast.

The beamlet normally is projected using first and second projection lenses. In such a situation, the axial distance from the knife-edged reference mark to the beam-limiting diaphragm is such that an axial angle (as measured at the knife-edge) subtended by the beam-limiting aperture is slightly greater than a beam-convergence angle (or half-aspect angle) of the beamlet at the substrate. One desirable range for "slightly greater" is 1.1 to 3 times the angle of convergence angle. For example, in a situation in which a dummy beam is used, if the diameter of the beam-limiting aperture is 50 μm or less (desirably about 10 μm), the axial angle (as measured at the knife-edge) subtended by the beam-limiting aperture is 10 mrad, the beam-convergence angle of the beamlet is 5 mrad, and the axial distance from the reference mark to the beam-limiting diaphragm is about 2.5 mm. In this example, nearly all the dummy beam transmitted through the membrane defining the knife-edged reference mark is blocked by the beam-limiting aperture plate, allowing beam-blur measurements to be obtained at full contrast.

The step of defining a measurement mark can comprise defining multiple beam-transmitting measurement marks in a subfield of a reticle disposed at the object plane. In this instance, the detecting step comprises detecting a distribution of beam blur within the subfield.

The method can further comprise defining a dummy pattern around the measurement mark, as defined in a subfield of the reticle disposed at the object plane. In this instance, as the measurement mark is illuminated with the charged particle beam, the charged particle beam illuminates the dummy pattern to produce at least one dummy beam propagating downstream of the measurement mark. The detection step comprises detecting a distribution of beam blur of the beamlet attributable to a space-charge effect resulting from the dummy beam.

The method can further include the step of disposing a second beam-limiting diaphragm downstream of the first beam-limiting diaphragm. The second beam-limiting diaphragm comprises a respective diaphragm plate defining a respective beam-limiting aperture, wherein the respective diaphragm plate blocks charged particles scattered by the charged-particle scattering membrane. Thus, measurement contrast is further enhanced.

In another method embodiment, a beam-transmitting measurement mark is defined at an object plane, and a knife-edged reference mark is defined, at an image plane, as a corresponding through-hole in a charged-particle-scattering membrane. The measurement mark is illuminated with a charged particle beam to form a charged-particle beamlet propagating downstream of the measurement mark toward the reference mark. The beamlet is projected onto the reference mark while scanning the beamlet over a knife-edge of the reference mark to produce non-scattered charged particles transmitted through the through-hole and forward-scattered charged particles transmitted through the membrane. The non-scattered and forward-scattered charged particles propagate downstream of the reference mark. Using a detector situated downstream of the reference mark, a beam current of charged particles propagating downstream of the reference mark is detected. Between the reference mark and the detector, the non-scattered charged particles are selectively allowed to propagate to the detector while propagation of most of the forward-scattered charged particles to the detector is blocked. With this embodiment, beam blur can be measured at high accuracy without adversely affecting measurement contrast. The measurement of beam blur can be accomplished, for example, by determining the distance over which a rise (12% to 88%) of the differentiation waveform of the detected beam current is observed.

The knife-edged reference mark can be defined as a corresponding aperture defined in a charged-particle-scattering membrane. Use of a thin-film membrane (made of silicon with a thickness of 2 μm, for example) facilitates formation of a high-quality knife-edge having a desired straightness and absence of edge roughness.

In the method embodiment summarized above, the excluding step can comprise defining a beam-limiting aperture in a beam-limiting aperture plate, and disposing the beam-limiting aperture plate between the reference mark and the detector such that the non-scattered charged particles pass through the beam-limiting aperture and most of the forward-scattered charged particles are blocked by the aperture plate. The projecting step can be performed using a projection-lens system comprising a first projection lens and a second projection lens. In this instance the beam-limiting aperture desirably has a diameter such that an axial angle of the beam-limiting aperture as measured at the knife-edge is slightly greater than an angle of convergence of the beamlet at the substrate (i.e., at the image plane).

For example, if the acceleration voltage of the charged particle beam illuminating the measurement mark is 100 kV and the angle of convergence of the beamlet 6 mrad, then the axial angle of the beam-limiting aperture as measured at the knife-edge is 6 to 10 mrad. With such a configuration, 100% of the non-scattered charged particles electrons pass through the beam-limiting aperture, whereas only 0.1% or less of the forward-scattered electrons pass through, allowing measurements to be obtained at maximal contrast.

Another aspect of the invention is set forth in the context of a CPB microlithography apparatus in which a reticle, defining a pattern to be transferred to a sensitive substrate, is irradiated with a charged-particle illumination beam to form a charged-particle patterned beam. The patterned beam is formed by passage of the illumination beam through an illuminated portion of the reticle. The patterned beam carries an aerial image of the illuminated portion of the reticle; the aerial image is projected onto a sensitized surface of a substrate. Specifically, in such an apparatus, a device is provided for evaluating imaging performance of the apparatus. An embodiment of such a device comprises a beam-transmitting measurement mark situated at an object plane of the CPB microlithography apparatus, and a knife-edged reference mark defined at an image plane as a corresponding through-hole in a charged-particle-scattering membrane. An illumination-lens assembly is situated and configured to direct a charged particle beam at the measurement mark so as to form a charged-particle beamlet propagating downstream of the measurement mark toward the reference mark. A projection-lens assembly is situated and configured to project the beamlet onto the reference mark and to scan the beamlet over a knife-edge of the reference mark. Non-scattered charged particles transmitted through the through-hole and forward-scattered charged particles transmitted through the membrane propagate downstream to a beam-limiting diaphragm situated downstream of the reference mark. The beam-limiting diaphragm comprises a diaphragm plate defining a beam-limiting aperture that passes the non-scattered charged particles as the diaphragm plate blocks most of the forward-scattered charged particles. The device also includes a detector situated and configured to detect a beam current of the charged particles propagating downstream of the beam-limiting diaphragm.

The beam-limiting diaphragm can be regarded as a first beam-limiting diaphragm in a device embodiment that includes a second beam-limiting diaphragm situated between the first beam-limiting diaphragm and the detector. The second beam-limiting diaphragm comprises a respective diaphragm plate defining a respective aperture. The respective aperture is configured to pass the non-scattered charged particles as the respective diaphragm plate blocks the forward-scattered charged particles.

Another device embodiment comprises a beam-transmitting measurement mark situated at an object plane of the CPB microlithography apparatus, and a knife-edged reference mark defined at an image plane as a corresponding through-hole in a charged-particle-scattering membrane. The reference mark is situated such that a charged-particle beamlet formed by passage of a charged particle beam through the measurement mark can be scanned over the reference mark to produce non-scattered charged particles passing through the reference mark and forward-scattered charged particles passing through the membrane. A beam-limiting diaphragm is situated downstream of the reference mark. The beam-limiting diaphragm comprises a diaphragm plate defining a beam-limiting aperture that passes the non-scattered charged particles as the diaphragm plate blocks most of the forward-scattered charged particles. A detector is situated downstream of the beam-limiting diaphragm and is configured to detect a beam current of the charged particles propagating downstream of the beam-limiting diaphragm. Connected to the detector is a beam-blur measurement means configured to measure beam blur from detection data obtained by the detector.

The beam-limiting diaphragm can be regarded as a first beam-limiting diaphragm in device embodiments that further comprise a second beam-limiting diaphragm situated between the first beam-limiting diaphragm and the detector. The second beam-limiting diaphragm comprises a respective diaphragm plate that defines a respective aperture. The respective aperture is configured to pass the non-scattered charged particles as the respective diaphragm plate blocks the forward-scattered charged particles.

The beam-limiting diaphragm can be situated 2–20 mm, for example, downstream of the knife-edged reference mark. The detector can be a combination of a photomultiplier and a scintillator, a Faraday cup, or a semiconductor detector, any of which providing high-sensitivity detection of beam blur.

The foregoing and additional features and advantages of the invention will be more readily apparent from the following detailed description, which proceeds with reference to the accompanying drawings.

DETAILED DESCRIPTION

Various aspects of the invention are described below in the context of representative embodiments, which are not intended to be limiting in any way. Although the various embodiments are described as utilizing an electron beam as an exemplary charged particle beam, the general principles set forth herein are applicable with equal facility to use of an alternative charged particle beam such as an ion beam.

First Representative Embodiment

Figure 1:
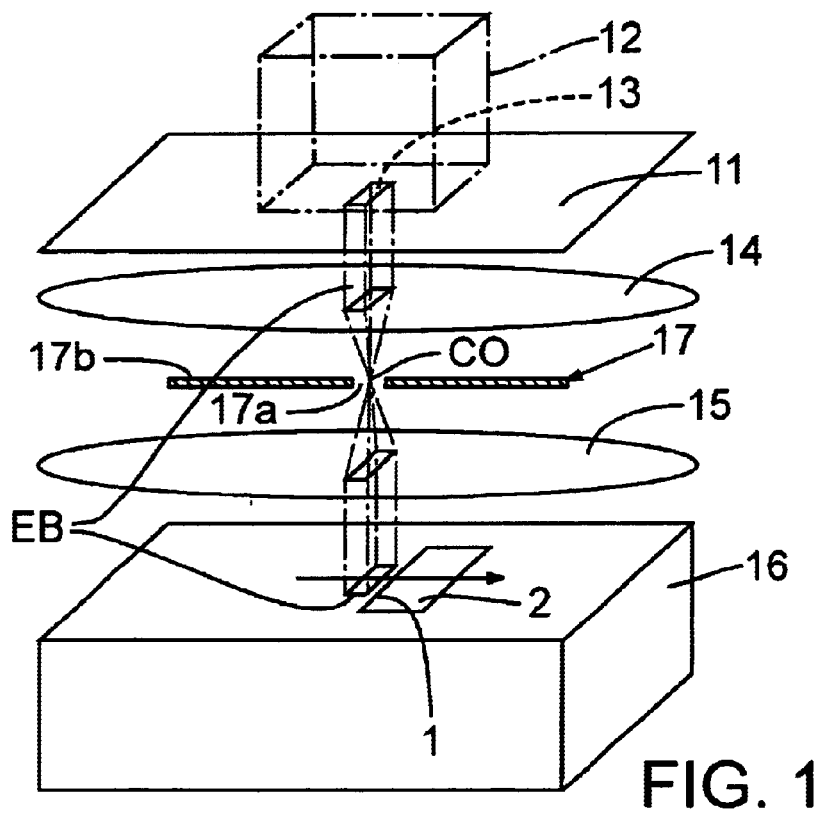
FIG. 1 is an oblique elevational view schematically illustrating certain optical-system features and relationships (in the vicinity of the wafer stage and projection-optical system) of an electron-beam microlithography system according to a first representative embodiment.

This embodiment is depicted in FIGS. 1, 2, 3, and 4(A)–4(C). Turning first to FIG. 1, certain optical-system components of an electron-beam microlithography system in the vicinity of the wafer stage are shown. At the upstream end of the depicted apparatus an illumination beam 12 is shown incident on a reticle 11. The illumination beam 12 is emitted from an electron gun (not shown) and formed by an illumination-optical system (not shown, but well understood to be located between the electron gun and the reticle 11) so as to be collimated as it is incident on the reticle 11. The reticle 11 defines one or more "measurement marks" as used for measuring beam blur, and also can define an actual lithographic pattern. The reticle 11 also represents an "object plane" of the depicted system. In this embodiment, the measurement marks include a mark 13 defined as a rectangular aperture (through-hole). As the illumination beam 12 is incident on the measurement mark 13, a portion of the beam passes through the mark without experiencing any absorption or scattering of electrons by the reticle 11. The portion of the beam 12 transmitted through the measurement mark 13 is thus formed into a collimated beamlet EB having a rectangular transverse profile.

First and second projection lenses 14, 15, respectively, define a two-stage projection-lens system disposed downstream of the reticle 11. A contrast diaphragm 17 is situated between the projection lenses 14, 15. The beamlet EB formed by the measurement mark 13 in the reticle 11 is converged by the first projection lens 14 to form a crossover CO in the center of an aperture 17a defined by a contrast diaphragm 17. The contrast diaphragm 17 comprises a plate 17b that blocks electrons of the beamlet EB that were forward-scattered during passage through the reticle 11 (i.e., only non-scattered electrons pass through the aperture 17a).

A wafer stage 16 is situated downstream of the second projection lens 15. The wafer stage 16 is configured to hold a suitable "sensitive" lithographic substrate such as a semiconductor wafer having an upstream-facing surface coated with a "resist" that is sensitive in an image-imprinting manner to exposure by the beamlet EB from the reticle 11. The wafer stage 16 includes a knife-edged reference mark 2 defined in, desirably, a silicon thin film 3 having a thickness of about 2 $\mu$m, for example. The substrate and the thin film 3 on the wafer stage 16 define a plane representing an "image plane" of the depicted system. A knife-edge 1 of the reference mark 2 is shown. A knife-edge 1 formed on such a thin film 3 easily provides a high-quality straight edge having minimal edge roughness. Mounted to the upstream-facing surface of the wafer stage 16 is a wafer chuck (not shown but well understood in the art) on which a wafer or other suitable substrate (not shown) is mounted for lithographic exposure.

Figure 2:
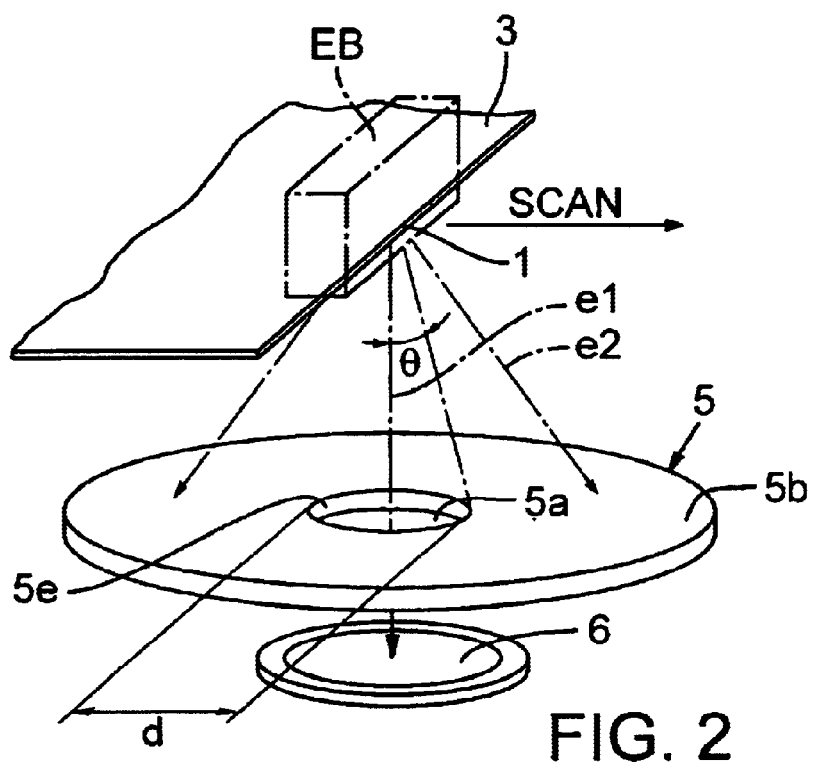
FIG. 2 is an oblique elevational view schematically illustrating the manner in which beam blur is measured according to the first representative embodiment.
Figure 3:
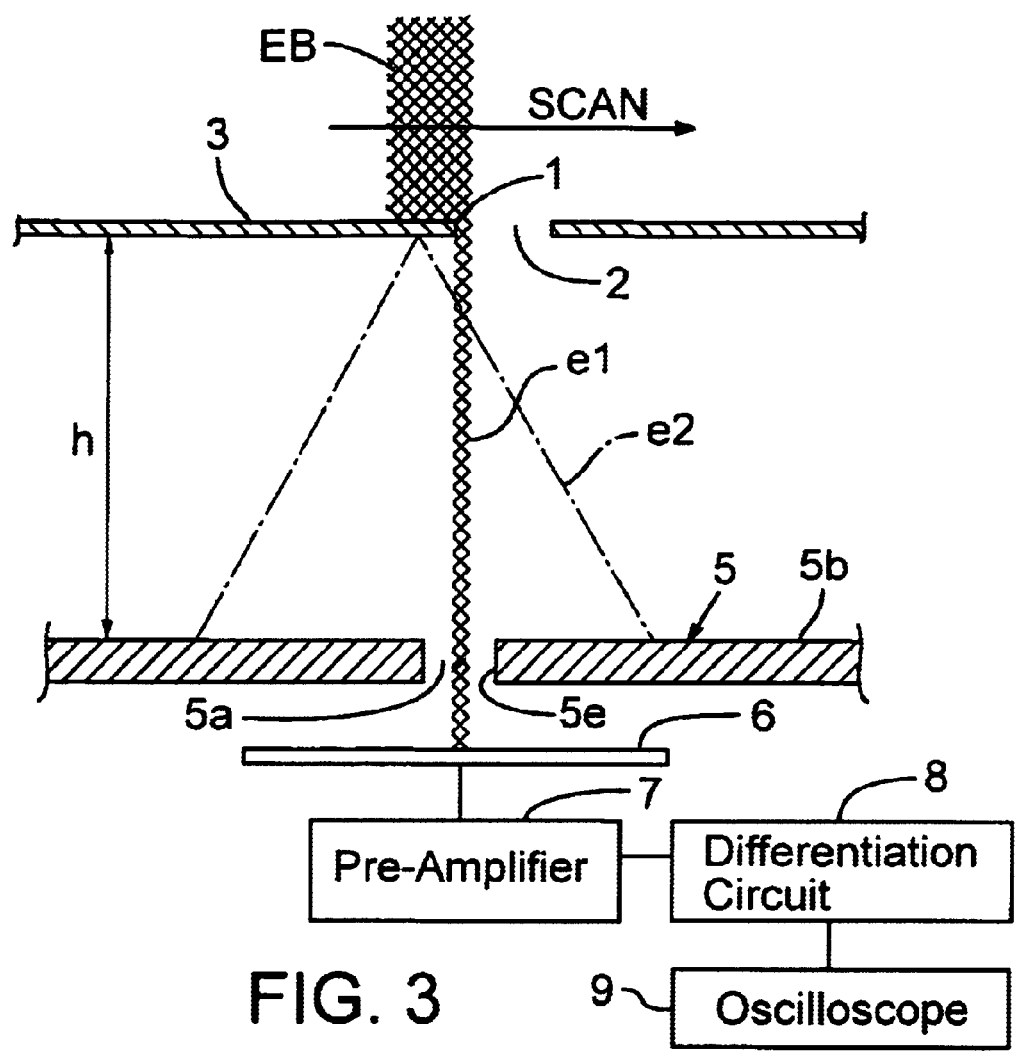
FIG. 3 is a schematic elevational view of the arrangement of components shown in FIG. 2.

As detailed in FIGS. 2 and 3, a beam-limiting diaphragm 5 is disposed downstream of the knife-edged reference mark 2. The beam-limiting diaphragm 5 comprises a plate 5b that defines a beam-limiting aperture 5a having a diameter "d" (FIG. 2). The axial distance (denoted "h" in FIG. 3) from the beam-limiting diaphragm 5 to the knife-edged reference mark 2 typically is a value between a few millimeters (mm) to about 20 mm. In general, the diameter "d" of the aperture 5a is sufficient to block "most"(at least 90%) of the electrons e2. In this regard, referring to FIG. 2, note a right triangle having an apex at the knife-edge 1, a first side extending (along the trajectory e1) from the apex to the center of the aperture 5a, a second side extending from the center to the edge 5e of the aperture 5a, and a hypotenuse extending from the edge 5e to the apex. The apex of the triangle has an angle θ, which represents the axial angle of the beam-limiting aperture as measured at the knife-edge. In order for the beam-limiting aperture 5a to block most of the electrons e2, the diameter "d" of the aperture 5a desirably is such that the angle θ is "slightly greater"(i.e., 1.1 to 3 times greater) than the angle of convergence of the beamlet EB at the substrate (image plane).

Desirably, d≈2hθ. If d<2hθ, then not only scattered electrons but also non-scattered electrons are blocked by the beam-limiting diaphragm 5, which reduces the signal and contrast. On the other hand, if d is much larger than 2hθ, then a significant portion of the scattered electrons pass through the beam-limiting aperture 5a, which reduces contrast. In this embodiment an exemplary range of the diameter d is 100 to 200 μm. The plate 5b of the beam-limiting diaphragm 5 desirably is made of an electro-conductive metal and has a thickness (1 mm, for example) sufficient for absorbing electrons incident on the plate 5b.

An electron detector (sensor) 6 is situated downstream of the beam-limiting aperture 5a. The electron detector 6 desirably comprises a combination of a photomultiplier and a scintillator, a Faraday cup, or a semiconductor detector. The electron detector 6 is connected to a pre-amplifier 7, a differentiation circuit 8, and an oscilloscope (or analogous display) 9.

With a device as shown in FIGS. 2 and 3, as the rectangular beamlet EB (downstream of the second projection lens 15) is scanned over the knife-edge 1, electrons not absorbed by the thin film 3 (i.e., electrons e1 that pass through the knife-edged reference mark 2 without experiencing any scattering, and electrons e2 that are forward-scattered during transmission through the thin film 3) propagate downstream. The electrons e1, e2 then reach the beam-limiting diaphragm 5. The non-scattered electrons e1 pass through the beam-limiting aperture 5a, while most (at least 90% of) the forward-scattered electrons e2 are blocked by the plate 5b. As a result, essentially only the non-scattered electrons e1 are detected by the electron detector 6.

Figure 4A:
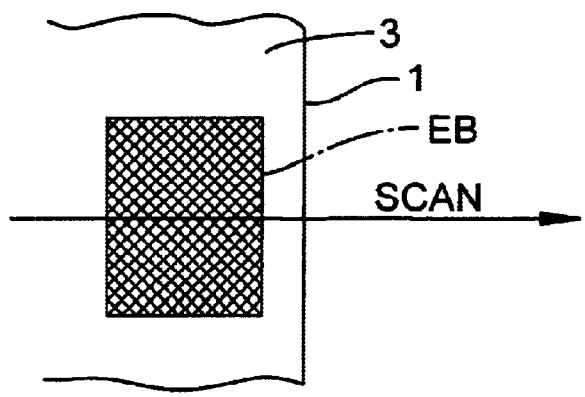
FIG. 4(A) is a schematic plan view of the beamlet EB being scanned over a knife-edge of the measurement mark, as discussed in the first representative embodiment.
Figure 4B:
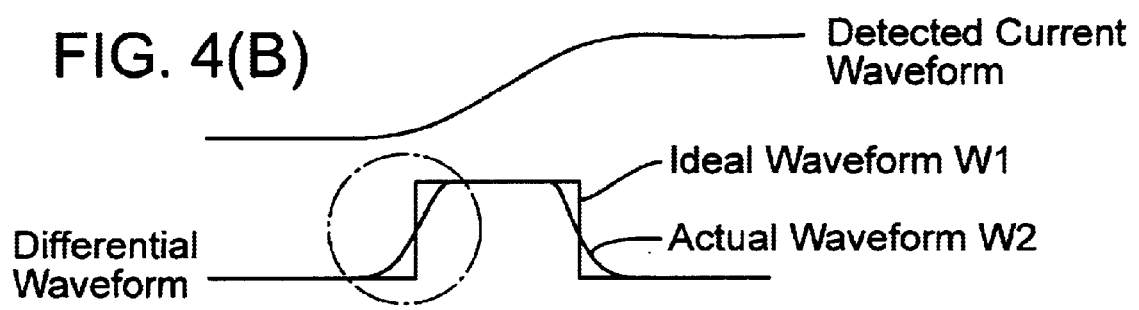
FIG. 4(B) depicts exemplary plots of detected current waveform, ideal waveform, actual waveform, and differential waveform obtained in the first representative embodiment.

An exemplary beam current of non-scattered electrons e1 detected by the electron detector 6 is depicted as the upper graph in FIG. 4(B). This waveform is of detected beam current. As shown in FIG. 4(A), the beamlet EB is scanned over the knife-edge 1 in the direction of the "SCAN" arrow (i.e., to the right in the figure). As the beamlet EB passes over the knife-edge 1, the proportion of the beamlet EB propagating past the knife-edge 1 progressively increases, indicated by a corresponding increase in the beam current detected by the detector 6 (FIG. 4(B)). Specifically, in FIG. 4(B), note the rise in detected beam current as indicated by the rise to the right in the upper curve. This beam current is amplified by the pre-amplifier 7 and converted to a plot of percentage change versus time by the differentiation circuit 8.

Figure 4C:
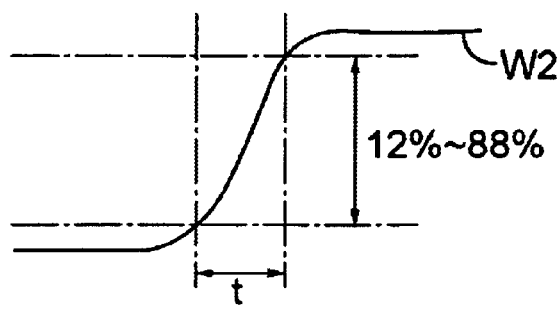
FIG. 4(C) is an enlargement of the rising portion of the actual waveform shown in FIG. 4(B).

An exemplary differential waveform output from the differentiation circuit 8 is shown as the lower curve in FIG. 4(B). Ideally, the differential waveform has a rectangular profile W1 if the beamlet EB has no blur. In practice, an actual differential waveform W2 has sloped sides resulting from beam blur. Referring to FIG. 4(C), the distance "t" over which the waveform W2 exhibits a rise is regarded as being situated within the range of 12% to 88% maximum beam intensity of the differential waveform. Beam blur is quantified by determining the distance t. The output waveform of the differentiation circuit 8 is displayed on the oscilloscope 9. Beam adjustment (e.g., calibration of focal point, astigmatism, magnification, rotation, and/or other parameters) and evaluation of imaging performance are performed on the basis of the waveform displayed on the oscilloscope 9.

A specific numerical example of the angle θ (see FIG. 2) is established as follows for an electron-beam microlithography apparatus. If the acceleration voltage of the illumination beam 12 is 100 kV, and the angle of convergence of the beamlet EB at the projection lens is 6 mrad, then the aperture angle θ established by the edge 5e of the beam-limiting aperture 5a (as seen from the knife-edge 1) is 6 to 10 mrad. In such an instance, approximately 100% of the non-scattered electrons e1 pass through the aperture 5a, whereas no more than approximately 0.1% of the forward-scattered electrons e2 pass through. Under such conditions, beam-blur measurements can be made at nearly full contrast.

Second Representative Embodiment

Figure 5:
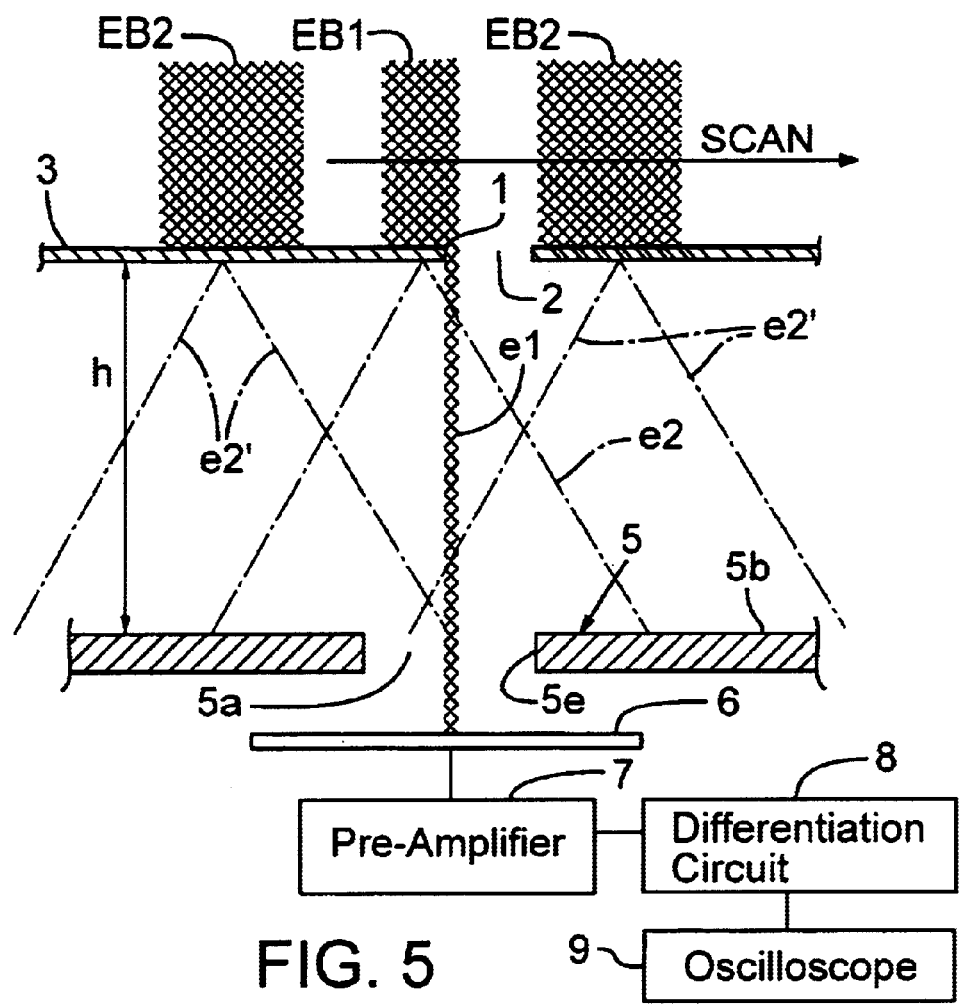
FIG. 5 is a schematic elevational view of a beam-blur measurement performed according to the second representative embodiment.
Figure 6:
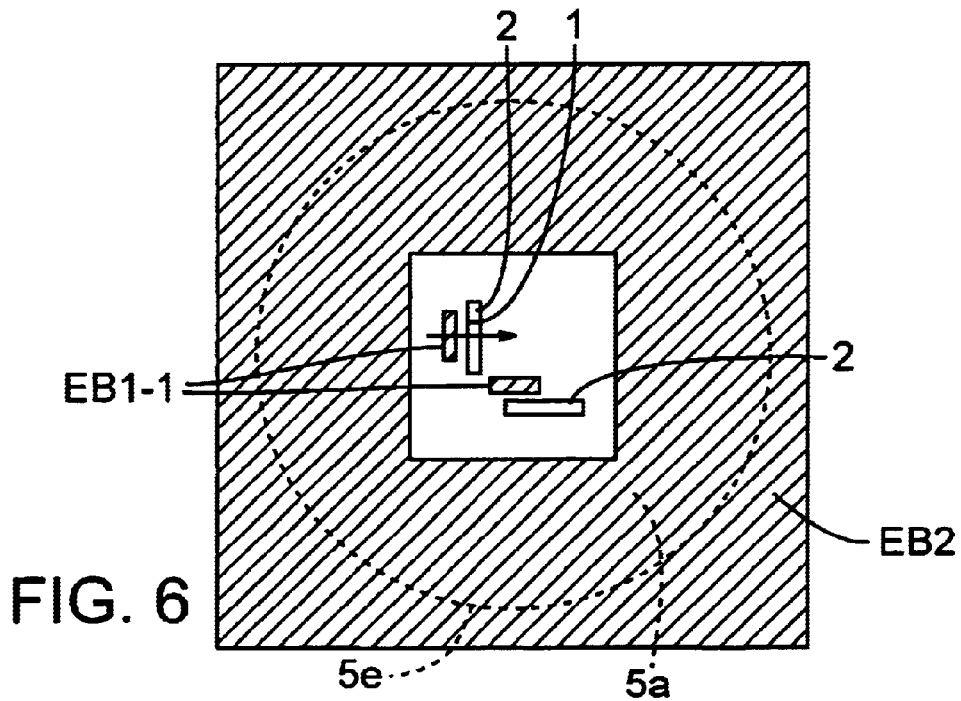
FIG. 6 is a plan view schematically illustrating size and shape relationships of electron beams and apertures used in the method of FIG. 5.

This embodiment is depicted in FIGS. 5 and 6, in which components that are similar to respective components in FIG. 2 have the same respective reference numerals. FIG. 5 is a schematic elevational view with accompanying block diagram, and FIG. 6 is a schematic plan view showing size and shape relationships of electron beams and apertures used in the method. Turning first to FIG. 6, a dummy beam EB2 having a relatively large, hollow transverse profile (with a square-shaped central void) surrounds much smaller measurement beamlets EB1-1. The dummy beam EB2 exerts a Coulomb effect on the measurement beamlets EB1-1. Hence, beam blur is measured under actual exposure conditions in which the Coulomb effect is assumed as being present. The hollow-square profile of the dummy beam EB2 is actually an aerial image of mesh holes in a pattern (defined by an upstream reticle, not shown) used for experimentally varying the pattern-element density of a projected pattern. As shown, the dummy beam EB2 is configured so as to surround the beamlets EB1-1, which are clustered at the center of the void in the dummy beam.

A beam-limiting diaphragm 5 is situated downstream of the knife-edged reference mark 2. The beam-limiting diaphragm 5 comprises a plate 5b that defines an aperture 5a (usually round; FIG. 6). The edge of the plate 5b around the aperture 5a is denoted 5e. The axial distance (denoted "h" in FIG. 5) between the beam-limiting diaphragm 5 and the knife-edged reference mark 2 can range from a few millimeters (mm) to about 20 mm. The plate 5b of the beam-limiting diaphragm 5 is made of an electro-conductive metal and has a defined thickness (e.g., 1 mm thick) sufficient for absorbing incident electrons. The electron detector (sensor) 6 is situated downstream of the beam-limiting diaphragm 5. As in FIG. 3, the configuration shown in FIG. 5 includes a pre-amplifier 7, a differentiation circuit 8, and an oscilloscope 9 connected to the sensor 6.

Whenever the beamlets EB1 and the dummy beam EB2 are scanned over the knife-edged reference mark 2, electrons not absorbed by the plate 3 are transmitted downstream of the plate 3. These transmitted electrons comprise non-scattered electrons e1 of the beamlets EB1 that passed through the reference mark 2, forward-scattered electrons e2 of the beamlets EB1 that passed (with forward-scattering) through the plate 3, and forward-scattered electrons e2' of the dummy beam EB2 that passed (with forward-scattering) through the plate 3. The electrons e1, e2, and e2' propagate to the beam-limiting diaphragm 5. The non-scattered electrons e1 pass through the aperture 5a. Some of the forward-scattered electrons e2 are blocked by the aperture plate 5b. Also, some of the forward-scattered electrons e2' of the dummy beam EB2 are blocked by the aperture plate 5b.

Third Representative Embodiment

In the second representative embodiment many electrons e2 and e2' pass through the aperture 5a and reach the electron detector 6. In view of these conditions and because the dummy beam EB2 is larger in transverse profile than the beamlet EB1, the number of electrons of the dummy beam EB2 that reaches the detector 6 could be sufficiently large to provide less than optimal results for certain applications. This third representative embodiment addresses these concerns.

The third representative embodiment is depicted in FIGS. 7, 8, 9(A)–9(B), and 10(A)–10(C), with reference also being made to FIG. 1. In this embodiment, components that are similar to respective components in the first representative embodiment have the same respective reference numerals.

Referring first to FIG. 1, certain optical-system components in the vicinity of the wafer stage are shown. At the upstream end of the depicted apparatus an illumination beam 12 is shown incident on a reticle 11. The illumination beam 12 is emitted from an electron gun (not shown) and formed by an illumination-optical system (not shown, but well understood to be located between the electron gun and the reticle 11) so as to be collimated as it is incident on the reticle 11. The reticle 11 defines one or more "measurement marks" as used for measuring beam blur, and also can define an actual lithographic pattern. In this embodiment, the measurement marks include a mark 13 defined as a rectangular aperture (through-hole). As the illumination beam 12 is incident on the measurement mark 13, a portion of the beam passes through the mark without experiencing any absorption or scattering of electrons by the reticle 11. The portion of the beam 12 transmitted through the measurement mark 13 is thus formed into a collimated beamlet EB having a rectangular transverse profile.

First and second projection lenses 14, 15, respectively, define a two-stage projection-lens system disposed downstream of the reticle 11. A contrast diaphragm 17 is situated between the projection lenses 14, 15. The beamlet EB formed by the measurement mark 13 in the reticle 11 is converged by the first projection lens 14 to form a crossover CO in the center of an aperture 17a defined by a contrast diaphragm 17. The contrast diaphragm 17 blocks electrons of the beamlet EB that were scattered during passage through the reticle 11 (i.e., only non-scattered electrons pass through the aperture 17a).

A wafer stage 16 is situated downstream of the second projection lens 15. The wafer stage 16 is configured to hold a suitable "sensitive" lithographic substrate such as a semiconductor wafer having an upstream-facing surface coated with a "resist" that is sensitive in an image-imprinting manner to exposure by the beam from the reticle 11. The wafer stage 16 includes a knife-edged reference mark 2 defined in, desirably, a silicon thin film 3 having a thickness of about 2 $\mu$m, for example. A knife-edge 1 of the reference mark 2 is shown. A knife-edge 1 formed on such a thin film 3 easily provides a high-quality straight edge having minimal edge roughness. Mounted to the upstream-facing surface of the wafer stage 16 is a wafer chuck (not shown but well understood in the art) on which a wafer or other suitable substrate (not shown) is mounted for lithographic exposure.

Figure 9A:
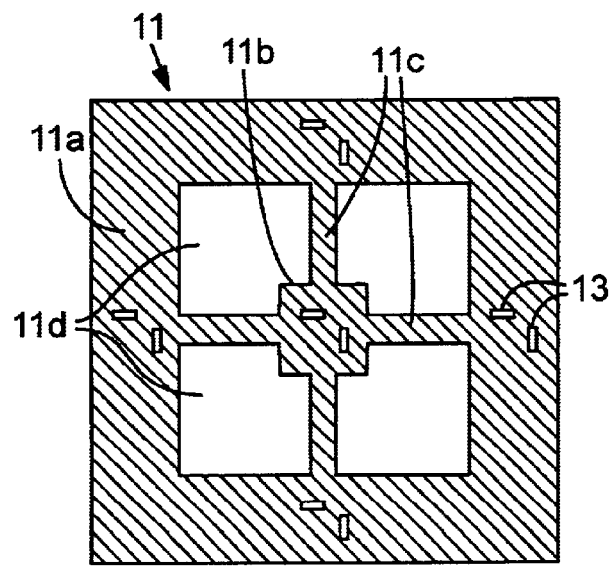
FIG. 9(A) is a plan view of a reticle subfield including rectangular apertures used for measuring beam blur, as described in the third representative embodiment.

Turning now to FIG. 9(A), a subfield pattern (e.g., having dimensions of 250 $\mu$m square on the reticle 11) is shown. The depicted subfield has a peripheral zone 11a having a square-frame configuration. The peripheral zone 11a surrounds a square center portion 11b connected to the peripheral zone 11a by four connecting portions 11c. The subfield also includes four electron-transmissive regions 11d situated between the peripheral zone 11a and the center portion 11b. A respective group of rectangular measurement marks 13 is defined at each of five locations: four locations in the peripheral zone 11a and one location in the center portion 11b. Two measurement marks 13 are in each group, one extending in the X direction and the other extending in the Y direction. The electron-transmissive regions 11d can define respective portions of the overall pattern, defined by the reticle 11, to be lithographically transferred to a substrate.

Figure 9B:
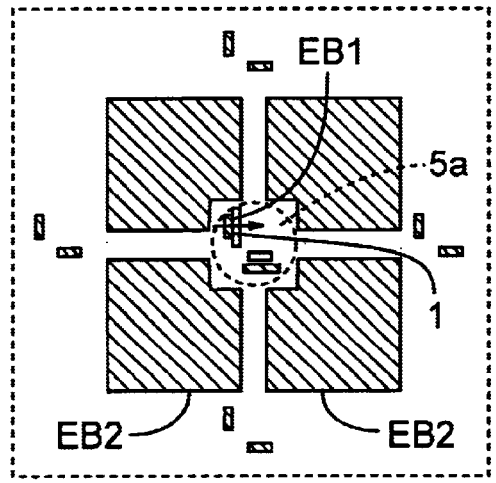
FIG. 9(B) is a plan view of the aerial image produced by the subfield of FIG. 9(A).

Referring now to FIG. 9(B), incidence of an illumination beam 12 on a group of measurement marks 13 in the reticle 11 produces two corresponding collimated rectangular measurement beamlets EB1. Portions of the illumination beam passing through the transmissive regions 11d become respective dummy beams EB2 that serve to adjust beam current for purposes of correcting space-charge effects. The dummy beams EB2 exert a Coulomb effect on the measurement beamlets EB1. Producing the dummy beams EB2 allows measurements of beam blur to be obtained during an actual pattern exposure. FIG. 1 schematically illustrates one measurement beamlet EB1 produced by passage of a corresponding portion of the illumination beam 12 through a single measurement mark 13.

Figure 7:
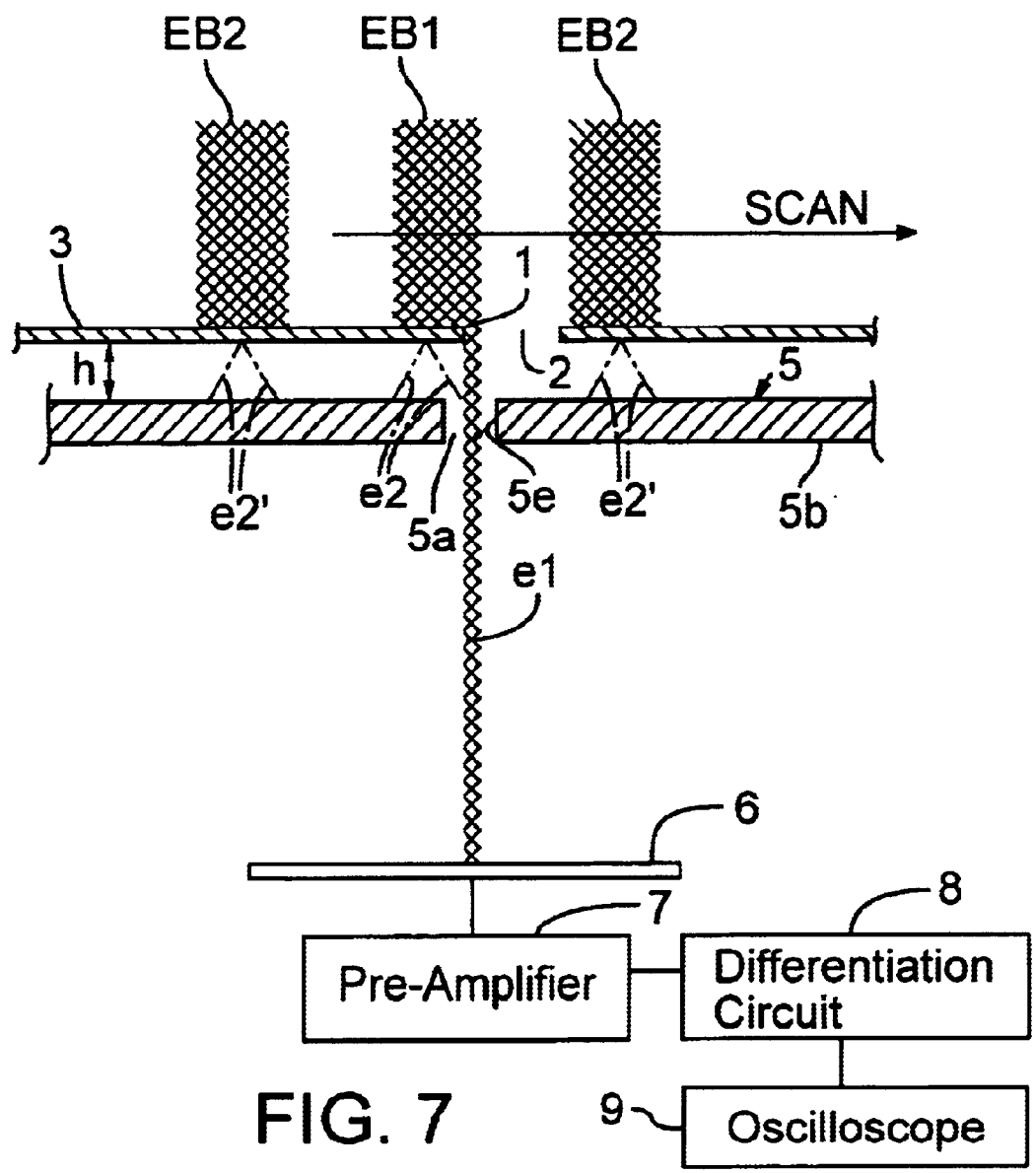
FIG. 7 is a schematic elevational view of a beam-blur measurement performed according to the third representative embodiment.
Figure 8:
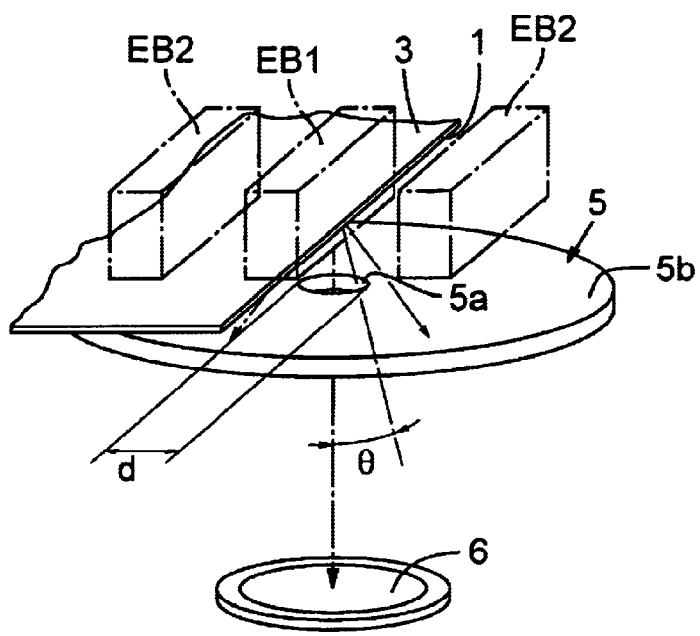
FIG. 8 is an oblique elevational view schematically illustrating the manner in which beam blur is measured according to the third representative embodiment.

As shown in FIGS. 7 and 8, a beam-limiting diaphragm 5 is situated downstream of the knife-edged reference mark 2. The beam-limiting diaphragm 5 comprises a plate 5b desirably made of an electro-conductive metal and having a thickness (e.g., 1 mm) sufficient for absorbing incident charged particles. The aperture 5a defined by the plate 5b desirably has a diameter (denoted "d" in FIG. 8) of 50 $\mu$m or less (most desirably approximately 10 $\mu$m) to ensure adequate blocking of the dummy beams. In FIG. 7 the axial distance "h" is shorter than "h" in FIG. 3. Desirably, in FIG. 7, h<d/2$\alpha$, wherein $\alpha$ is the beam-convergence angle at the image plane. The axial distance h between the aperture 5a and the knife-edged reference mark 2 is such that the angle (denoted "$\theta$" in FIG. 8) of the edge 5e from the knife-edge 1 is slightly greater than the angle of convergence of the beamlet EB1 at the second projection lens 15. A desired range that falls within the scope of "slightly greater" is from 1.1 to 3 times the angle of convergence. By way of example, the angle $\theta$ is 10 mrad, the angle of convergence of the beamlet EB1 is 5 mrad, and h is approximately 2.5 mm.

The electron detector 6, situated downstream of the beam-limiting diaphragm 5, desirably comprises a combination of a photomultiplier and a scintillator, a Faraday cup, or a semiconductor detector. The detector 6 is connected to a pre-amplifier 7, a differentiation circuit 8, and an oscilloscope (or analogous display) 9.

Referring to FIG. 7, as the beamlet EB1 and the dummy beams EB2 pass through the second projection lens 15 and are scanned over the knife-edge 1, electrons not absorbed by the thin film 3 propagate downstream. These downstream-propagating electrons consist of non-scattered electrons e1 of the beamlet EB1 that pass through the reference mark 2, forward-scattered electrons e2 of the beamlet EB1, and forward-scattered electrons e2' of the dummy beams EB2. The electrons e1, e2, and e2' then reach the aperture 5a through which the non-scattered electrons e1 of the beamlet EB1 pass. "Nearly all" (i.e., at least 90% of) the forward-scattered electrons e2 of the beamlet EB1 and the forward-scattered electrons e2' of the dummy beams EB2 are blocked by the plate 5b. As a result, essentially only the non-scattered electrons e1 are detected by the electron detector 6.

Figure 10A:
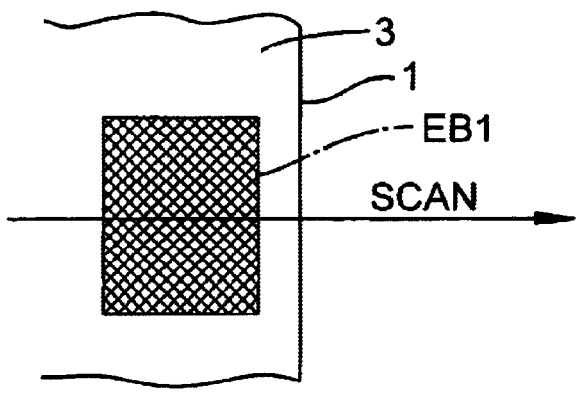
FIG. 10(A) is a schematic plan view of the beamlet EB1 being scanned over a knife-edge of the measurement mark, as discussed in the third representative embodiment.
Figure 10B:
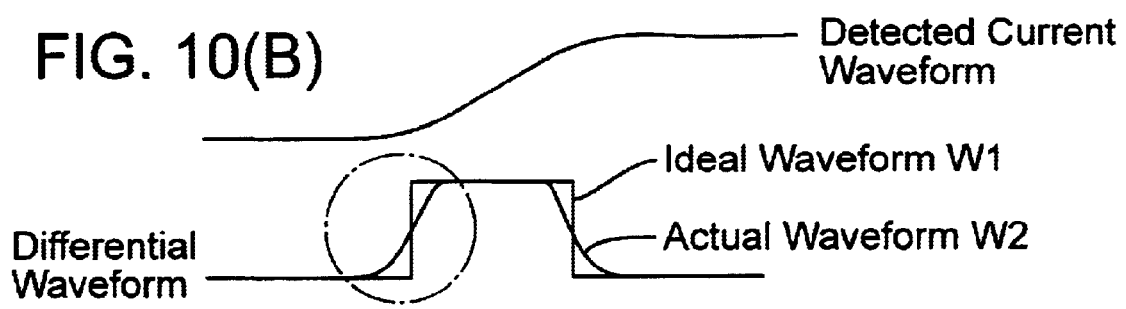
FIG. 10(B) depicts exemplary plots of detected current waveform, ideal waveform, actual waveform, and differential waveform obtained in the third representative embodiment.

The beam current of the non-scattered electrons e1 detected by the electron detector 6 produces a waveform as shown in the upper graph in FIG. 10(B). As shown in FIG. 10(A), as the beamlet EB1 passes over the knife-edge 1, the proportion of the beamlet EB1 propagating past the knife-edge 1 progressively increases, indicated by a corresponding increase in the beam current detected by the detector 6 (FIG. 10(B)). Specifically, in FIG. 10(B), note the rise in detected beam current as indicated by the rise to the right in the upper curve. This beam current is amplified by the pre-amplifier 7 and converted to a plot of percentage change versus time by the differentiation circuit 8.

Figure 10C:
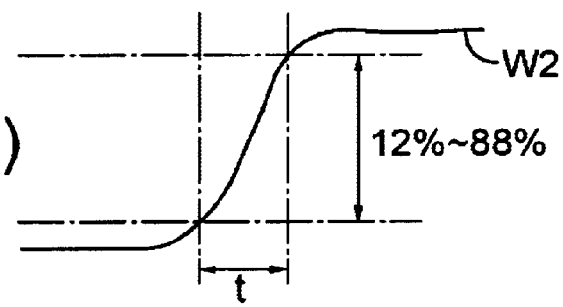
FIG. 10(C) is an enlargement of the rising portion of the actual waveform shown in FIG. 10(B).

An exemplary differential waveform output from the differentiation circuit 8 is shown as the lower curve in FIG. 10(B). Ideally, the differential waveform has a rectangular profile W1 if the beamlet EB1 has no blur. In actual practice, an actual differential waveform W2 has sloped sides resulting from beam blur. Referring to FIG. 10(C), the distance "t" over which the waveform W2 exhibits a rise is regarded as being situated within the range of 12% to 88% maximum beam intensity of the differential waveform. Beam blur is quantified by determining the distance t. The output waveform of the differentiation circuit 8 is displayed on the oscilloscope 9. Beam adjustment (e.g., calibration of focal point, astigmatism, magnification, rotation, and/or other parameters) and evaluation of imaging performance are performed on the basis of the waveform displayed on the oscilloscope 9.

Hence, as a result of most of the forward-scattered electrons e2' of the dummy beams EB2 being blocked by the plate 5b of the beam-limiting diaphragm 5, beam blur can be measured accurately and with low noise.

Fourth Representative Embodiment

Figure 11:
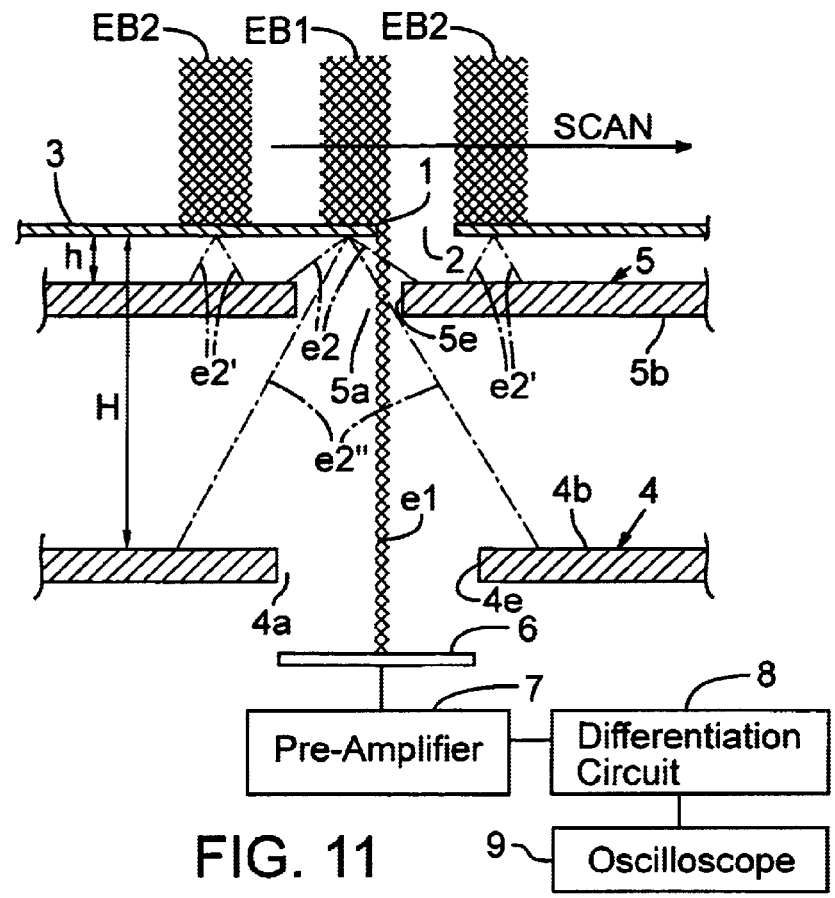
FIG. 11 is a schematic elevational view of a beam-blur measurement performed according to the fourth representative embodiment.

This embodiment is depicted in FIG. 11, in which components that are similar to respective components discussed in the second representative embodiment have the same respective reference numerals. This embodiment is essentially the same as the second representative embodiment except that this third representative embodiment includes not only a first beam-limiting diaphragm 5 but also a second beam-limiting diaphragm 4. This embodiment including two beam-limiting diaphragms is especially useful whenever one or more dummy beams is used. The second beam-limiting diaphragm 4 comprises a plate 4b that defines a respective beam-limiting aperture 4a and is situated between the first beam-limiting diaphragm 5 and the electron detector 6. The second beam-limiting diaphragm 4 is configured as an electro-conductive metal plate having a defined thickness of approximately 1 mm to ensure absorption by the plate 4b of incident charged particles. The axial distance (denoted "H" in FIG. 11) between the second beam-limiting diaphragm 4 and the knife-edged reference mark 2 desirably is in the range of approximately 10 to 20 mm. Desirably, h<d/2α (i.e., d>2hα), wherein α is the beam-convergence angle at the image plane. The aperture 4a desirably has a diameter of approximately 200 to 400 µm's. Note that the aperture 4a has a larger diameter than the aperture 5a in FIG. 7. The aperture 5a in FIG. 7 desirably has a diameter no greater than about 50 µm to ensure adequate blocking of the dummy beams. In contrast, the aperture 4a in FIG. 11 does not have to block dummy beams (because the aperture 5a already does so).

As shown in FIG. 11, as the beamlet EB1 and the dummy beams EB2 are scanned over the knife-edge 1, the electrons e1 of the beamlet EB1 that passed through the reference mark 2 without scattering propagate toward the first beam-limiting diaphragm 5. The electrons e2 of the beamlet EB1 that were forward-scattered during transmission through the thin film 3, and the electrons e2' of the dummy beams EB2 that were forward-scattered during transmission through the thin film 3 also propagate downstream to the first beam-limiting diaphragm 5. The non-scattered electrons e1 pass through the beam-limiting aperture 5a, and many of the forward-scattered electrons e2 are blocked by the first beam-limiting diaphragm plate 5b. Essentially all the electrons e2' of the dummy beams EB2 are blocked by the first beam-limiting diaphragm plate 5b. Many of the other forward-scattered electrons e2" (of the electrons e2 from the beamlet EB1) that passed through the first beam-limiting aperture 5a are blocked by the second beam-limiting diaphragm plate 4b. As a result, essentially only the non-scattered electrons e1 are detected by the electron detector 6, which further enhances contrast and allows beam blur to be measured with even greater accuracy.

Fifth Representative Embodiment

Figure 12A:
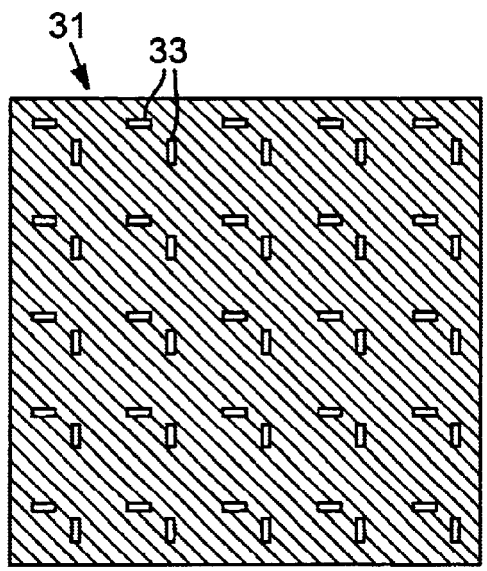
FIG. 12(A) is a plan view of a reticle subfield including rectangular apertures used for measuring beam blur, as described in the fifth representative embodiment.
Figure 12B:
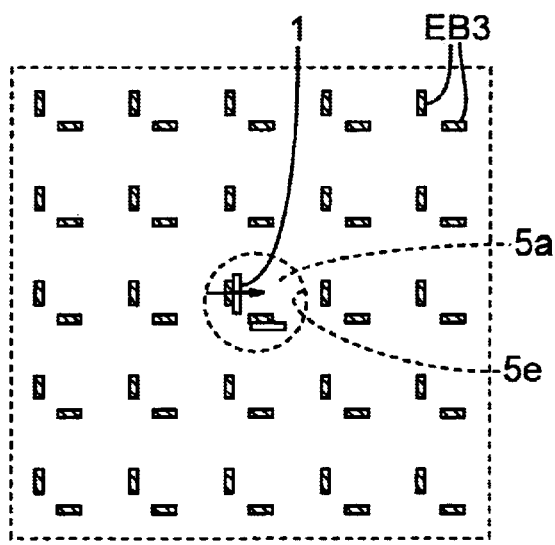
FIG. 12(B) is a plan view of the aerial image produced by the subfield of FIG. 12(A).
Figure 13:
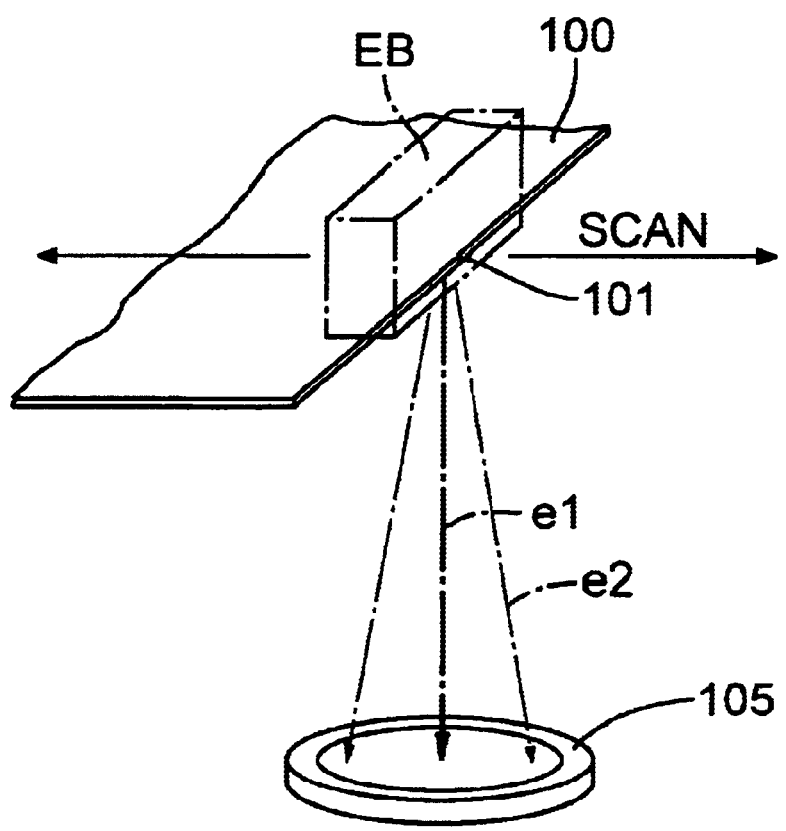
FIG. 13 is an oblique elevational view schematically illustrating a conventional method for measuring beam blur.
Figure 14:
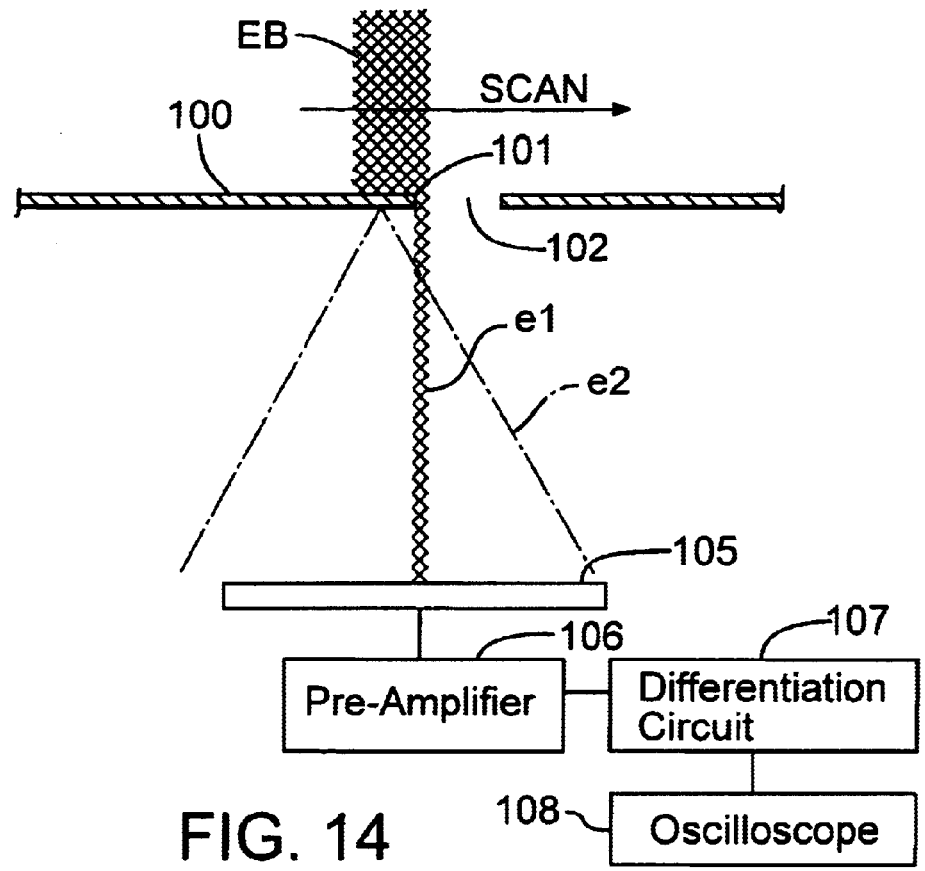
FIG. 14 is a schematic elevational view of a conventional apparatus (corresponding to the method shown in FIG. 13), with an accompanying block diagram.
Figure 15:
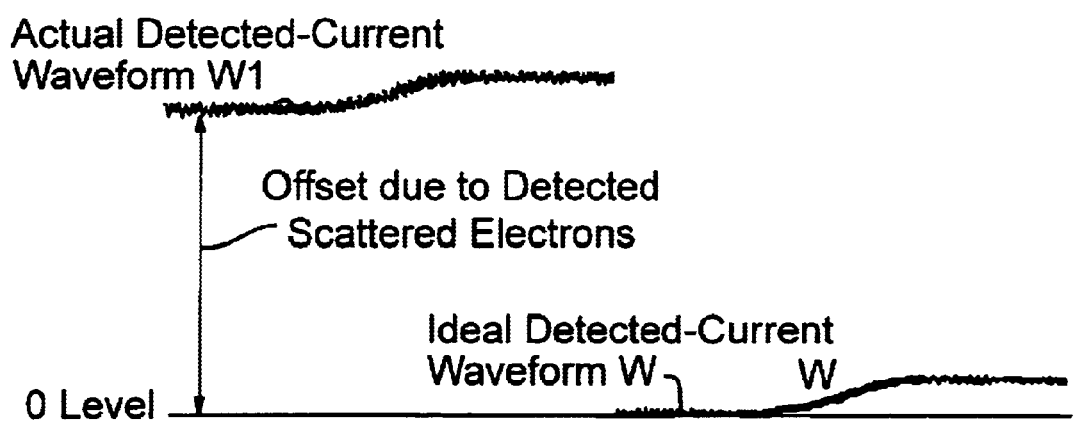
FIG. 15 includes graphs of beam-blur measurement results obtained using the conventional method shown in FIGS. 13–14.

FIG. 12(A) is a plan view of a reticle subfield 31 showing an exemplary pattern of reference marks 33 useful for measuring beam blur according to this embodiment, and FIG. 12(B) is a plan view of the aerial image produced by the subfield of FIG. 12(A). The reticle 31 of FIG. 12(A) (having dimensions of, e.g., 250 µm square) defines multiple pairs of rectangular apertures (reference marks 33). In each pair of reference marks 33, one aperture extends in the X direction and the other extends in the Y direction. The pairs of reference marks 33 are arranged in five rows and five columns within the subfield 31. The aerial image shown in FIG. 12(B) comprises groups of paired rectangular beamlets EB3.

The groups of beamlets EB3 of FIG. 12(B) can be used for measuring not only beam blur but also residual strain in a reticle subfield. Residual strain is based on differences in beam blur as measured at different locations within the subfield using respective pairs of beamlets. For example, the beam-limiting aperture 5 is disposed at the location shown in FIG. 12(B), and the respective pair of beamlets EB3 is scanned over the knife-edge 1. The locations of the beamlets EB3 with respect to the knife-edge 1 are determined from the scanning waveform detected by the detector (not shown, but see FIG. 2). After performing measurements using one pair of beamlets EB3, the wafer stage 16 is moved as required in the X and Y directions to reposition the beam-limiting aperture 5a, and the measurement is repeated for another pair of beamlets EB3. This protocol can be repeated to obtain measurements involving each of the pairs of beamlets EB3 produced by the subfield 31.

The overall strain of the subfield is determined based on the beam-blur-distribution data obtained with the various pairs of beamlets EB3. Based on the results of these measurements, the CPB microlithography apparatus can be adjusted as required (e.g., adjustments made to the CPB-optical system) to compensate for the strain. The compensation enables the CPB microlithography apparatus to produce optimal exposure results despite the strain in the subfield. The compensations (e.g., adjustment of focal point, astigmatism, magnification, rotation, and/or other parameters as required) can be performed in real time.

Therefore, high-accuracy measurements of beam blur can be made at multiple measurement locations within a reticle subfield, thereby facilitating exposure adjustments made in real time so as to realize high-accuracy exposures.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) micro lithography method in which a reticle, defining a pattern to be transferred to a sensitive substrate, is irradiated with a charged-particle illumination beam, and a charged-particle patterned beam, formed by passage of the illumination beam through an illuminated portion of the reticle and carrying an aerial image of the illuminated portion of the reticle, is projected onto a sensitive surface of a substrate to imprint the sensitive surface with the aerial image, a method for evaluating imaging performance, comprising:

defining a beam-transmitting measurement mark at an object plane;

defining a knife-edged reference mark, at an image plane, as a corresponding through-hole in a charged-particle-scattering membrane;

illuminating the measurement mark with a charged particle beam to form a charged-particle beamlet propagating downstream of the measurement mark toward the reference mark;

projecting the beamlet onto the reference mark while scanning the beamlet over a knife-edge of the reference mark to produce non-scattered charged particles transmitted through the through-hole and forward-scattered charged particles transmitted through the membrane, the non-scattered and forward-scattered charged particles propagating downstream of the reference mark;

disposing a beam-limiting diaphragm downstream of the reference mark, the beam-limiting diaphragm comprising a diaphragm plate defining a beam-limiting aperture having a diameter sufficient to block most of the forward-scattered charged particles while not blocking the non-scattered charged particles from reaching a detector, wherein an axial distance from the knife-edged reference mark to the beam-limiting diaphragm is such that an axial angle of the beam-limiting aperture as measured at the knife-edge is slightly greater than a convergence angle of the beamlet at the substrate; and detecting beam current of charged particles passing through the beam-limiting aperture.

2. The method of claim 1, wherein the step of projecting the beamlet is performed using first and second projection lenses.

3. The method of claim 1, wherein:

the step of defining a measurement mark comprises defining beam-transmitting measurement marks at multiple locations in a subfield of a reticle disposed at the object plane; and the detecting step comprises detecting beam blur at multiple locations within the subfield.

4. The method of claim 1, wherein the step of defining the measurement mark comprises defining the measurement mark as a respective aperture in a reticle membrane.

5. The method of claim 4, wherein the measurement mark is defined as a respective aperture in a subfield of a reticle.

6. The method of claim 5, further comprising defining a dummy pattern around the measurement mark, as defined in a subfield of the reticle disposed at the object plane.

7. The method of claim 6, wherein:

as the measurement mark is illuminated with the charged particle beam, the charged particle beam illuminates the dummy pattern to produce at least one dummy beam propagating downstream of the measurement mark; and the detection step comprises detecting beam blur of the beamlet attributable to a space-charge effect resulting from the dummy beam.

8. The method of claim 1, wherein, in the step of defining the reference mark, the corresponding through-hole in the charged-particle-scattering membrane is provided with a rectangular profile.

9. In a charged-particle-beam (CPB) microlithography method in which a reticle, defining a pattern to be transferred to a sensitive substrate, is irradiated with a charged-particle illumination beam, and a charged-particle patterned beam, formed by passage of the illumination beam through an illuminated portion of the reticle and carrying an aerial image of the illuminated portion of the reticle, is projected onto a sensitive surface of a substrate to imprint the sensitive surface with the aerial image, a method for evaluating imaging performance, comprising:

defining a beam-transmitting measurement mark at an object plane;

defining a knife-edged reference mark, at an image plane, as a corresponding through-hole in a charged-particle-scattering membrane;

illuminating the measurement mark with a charged particle beam to form a charged-particle beamlet propagating downstream of the measurement mark toward the reference mark;

projecting the beamlet onto the reference mark while scanning the beamlet over a knife-edge of the reference mark to produce non-scattered charged particles transmitted through the through-hole and forward-scattered charged particles transmitted through the membrane, the non-scattered and forward-scattered charged particles propagating downstream of the reference mark;

disposing a first beam-limiting diaphragm downstream of the reference mark, the first beam-limiting diaphragm comprising a diaphragm plate defining a beam-limiting aperture having a diameter sufficient to block most of the forward-scattered charted particles while not blocking the non-scattered charged particles from reaching a detector;

disposing a second beam-limiting diaphragm downstream of the first beam-limiting diaphragm, the second beam-limiting diaphragm comprising a respective diaphragm plate defining a respective beam-limiting aperture, the respective diaphragm plate blocking charged particles scattered by the charged-particle scattering membrane; and detecting beam current of charged particles passing through the beam-limiting apertures.

10. The method of claim 9, wherein an axial distance from the knife-edged reference mark to the beam-limiting diaphragm is such that an axial angle of the beam-limiting aperture as measured at the knife-edge is slightly greater than a convergence angle of the beamlet at the substrate.

11. The method of claim 9, wherein:

the step of defining a measurement mark comprises defining beam-transmitting marks at multiple locations in a subfield of a reticle disposed at the object plane; and the detecting step comprises detecting beam blur at the multiple locations within the subfield.

12. The method of claim 9, wherein the step of defining the measurement mark comprises defining the measurement mark as a respective aperture in a subfield of a reticle membrane, the method further comprising defining a dummy pattern around the measurement mark, as defined in a subfield of the reticle disposed at the object plane.

13. The method of claim 12, wherein:
as the measurement mark is illuminated with the charged particle beam, the charged particle beam illuminates the dummy pattern to produce at least one dummy beam propagating downstream of the measurement mark; and
the detection step comprises detecting beam blur of the beamlet attributable to a space-charge effect resulting from the dummy beam.

14. In a charged-particle-beam (CPB) microlithography apparatus for irradiating a reticle, defining a pattern to be transferred to a sensitive substrate, with a charged-particle illumination beam to form a charged-particle patterned beam, formed by passage of the illumination beam through an illuminated portion of the reticle and carrying an aerial image of the illuminated portion of the reticle, that is projected onto a sensitized surface of a substrate, a device for evaluating imaging performance, comprising:
a beam-transmitting measurement mark situated at an object plane of the CPB microlithography apparatus;
a knife-edged reference mark defined at an image plane as a corresponding through-hole in a charged-particle-scattering membrane;
an illumination-lens assembly situated and configured to direct a charged particle beam at the measurement mark so as to form a charged-particle beamlet propagating downstream of the measurement mark toward the reference mark;
a projection-lens assembly situated and configured to project the beamlet onto the reference mark and to scan the beamlet over a knife-edge of the reference mark to produce non-scattered charged particles transmitted through the through-hole and forward-scattered charged particles transmitted through the membrane;
a beam-limiting diaphragm situated downstream of the reference mark, the beam-limiting diaphragm comprising a diaphragm plate defining a beam-limiting aperture that passes the non-scattered charged particles as the diaphragm plate blocks most of the forward-scattered charged particles; and
a detector situated and configured to detect a beam current of the charged particles propagating downstream of the beam-limiting diaphragm.

15. The device of claim 14, wherein the beam-limiting diaphragm is a first beam-limiting diaphragm, the device further comprising a second beam-limiting diaphragm situated between the first beam-limiting diaphragm and the detector, the second beam-limiting diaphragm comprising a respective diaphragm plate defining a respective aperture, the respective aperture being configured to pass the non-scattered charged particles as the respective diaphragm plate blocks the forward-scattered charged particles.

16. In a charged-particle-beam (CPB) microlithography method in which a reticle, defining a pattern to be transferred to a sensitive substrate, is irradiated with a charged-particle illumination beam, and a charged-particle patterned beam, formed by passage of the illumination beam through an illuminated portion of the reticle, is projected onto a sensitive surface of a substrate to imprint the sensitive surface with the aerial image, a method for evaluating imaging performance, comprising:
defining a beam-transmitting measurement mark at an object plane;
defining a knife-edged reference mark, at an image plane, as a corresponding through-hole in a charged-particle-scattering membrane;
illuminating the measurement mark with a charged particle beam to form a charged-particle beamlet propagating downstream of the measurement mark toward the reference mark;
projecting the beamlet onto the reference mark while scanning the beamlet over a knife-edge of the reference mark to produce non-scattered charged particles transmitted through the through-hole and forward-scattered charged particles transmitted through the membrane, the non-scattered and forward-scattered charged particles propagating downstream of the reference mark;
using a detector situated downstream of the reference mark, detecting a beam current of charged particles propagating downstream of the reference mark; and
between the reference mark and the detector, selectively allowing the non-scattered charged particles to propagate to the detector while blocking propagation of most of the forward-scattered charged particles to the detector.

17. The method of claim 16, wherein the excluding step comprises:
defining a beam-limiting aperture in a beam-limiting aperture plate; and
disposing the beam-limiting aperture plate between the reference mark and the detector such that the non-scattered charged particles pass through the beam-limiting aperture and most of the forward-scattered charged particles are blocked by the aperture plate.

18. The method of claim 17, wherein the projecting step is performed using a projection-lens system comprising a first projection lens and a second projection lens.

19. In a charged-particle-beam (CPB) microlithography method in which a reticle, defining a pattern to be transferred to a sensitive substrate, is irradiated with a charged-particle illumination beam, and a charged-particle patterned beam, formed by passage of the illumination beam through an illuminated portion of the reticle, is projected onto a sensitive surface of a substrate to imprint the sensitive surface with the aerial image, a method for evaluating imaging performance, comprising:
defining a beam-transmitting measurement mark at an object plane;
defining a knife-edged reference mark, at an image plane, as a corresponding through-hole in a charged-particle-scattering membrane;
illuminating the measurement mark with a charged particle beam to form a charged-particle beamlet propagating downstream of the measurement mark toward the reference mark;
projecting the beamlet onto the reference mark while scanning the beamlet over a knife-edge of the reference mark to produce non-scattered charged particles transmitted through the through-hole and forward-scattered charged particles transmitted through the membrane, the non-scattered and forward-scattered charged particles propagating downstream of the reference mark;
using a detector situated downstream of the reference mark, detecting a beam current of charged particles propagating downstream of the reference mark; and placing a beam-limiting aperture, defined in a beam-limiting aperture plate, between the reference mark and the detector such that the non-scattered charged particles selectively pass through the beam-limiting aperture to the detector while most of the forward-scattered charged particles are blocked by the aperture plate from propagating to the detector, wherein the beam-limiting aperture has a diameter such that an axial angle of the beam-limiting aperture as measured at the knife-edge is slightly greater than a convergent angle of the beamlet at the second projection lens.

20. The method of claim 16, wherein the through-hole in the charged-particle-scattering membrane defining the knife-edged reference mark has a rectangular profile.

21. In a charged-particle-beam (CPB) microlithography apparatus for irradiating a reticle, defining a pattern to be transferred to a sensitive substrate, with a charged-particle illumination beam to form a charged-particle patterned beam, formed by passage of the illumination beam through an illuminated portion of the reticle and carrying an aerial image of the illuminated portion of the reticle, that is projected onto a sensitized surface of a substrate, a device for evaluating imaging performance, comprising:

a beam-transmitting measurement mark situated at an object plane of the CPB microlithography apparatus;

a knife-edged reference mark defined at an image plane as a corresponding through-hole in a charged-particle-scattering membrane, the reference mark being situated such that a charged-particle beamlet formed by passage of a charged particle beam through the measurement mark can be scanned over the reference mark to produce non-scattered charged particles passing through the reference mark and forward-scattered charged particles passing through the membrane;

a beam-limiting diaphragm situated downstream of the reference mark, the beam-limiting diaphragm comprising a diaphragm plate defining a beam-limiting aperture that passes the non-scattered charged particles as the diaphragm plate blocks most of the forward-scattered charged particles;

a detector situated downstream of the beam-limiting diaphragm and configured to detect a beam current of the charged particles propagating downstream of the beam-limiting diaphragm; and beam-blur measurement means connected to the detector and configured to measure beam blur from detection data obtained by the detector.

22. The device of claim 21, wherein the beam-limiting diaphragm is a first beam-limiting diaphragm, the device further comprising a second beam-limiting diaphragm situated between the first beam-limiting diaphragm and the detector, the second beam-limiting diaphragm comprising a respective diaphragm plate defining a respective aperture, the respective aperture being configured to pass the non-scattered charged particles as the respective diaphragm plate blocks the forward-scattered charged particles.

23. In a charged-particle-beam (CPB) microlithography apparatus for irradiating a reticle, defining a pattern to be transferred to a sensitive substrate, with a charged-particle illumination beam to form a charged-particle patterned beam, formed by passage of the illumination beam through an illuminated portion of the reticle and carrying an aerial image of the illuminated portion of the reticle, that is projected onto a sensitized surface of a substrate, a device for evaluating imaging performance, comprising:

a beam-transmitting measurement mark situated at an object plane of the CPB microlithography apparatus;

a knife-edged reference mark defined at an image plane as a corresponding through-hole in a charged-particle-scattering membrane, the reference mark being situated such that a charged-particle beamlet formed by passage of a charged particle beam through the measurement mark can be scanned over the reference mark to produce non-scattered charged particles passing through the reference mark and forward-scattered charged particles passing through the membrane;

a beam-limiting diaphragm situated 2–20 mm downstream of the knife-edged reference mark, the beam-limiting diaphragm comprising a diaphragm plate defining a beam-limiting aperture that passes the non-scattered charged particles as the diaphragm plate blocks most of the forward-scattered charged particles;

a detector situated downstream of the beam-limiting diaphragm and configured to detect a beam current of the charged particles propagating downstream of the beam-limiting diaphragm; and beam-blur measurement means connected to the detector and configured to measure beam blur from detection data obtained by the detector.

* * * * *

UNITED STATES PATENT AND TRADEMARK OFFICE
CERTIFICATE OF CORRECTION

PATENT NO. : 6,831,282 B2
DATED : December 14, 2004
INVENTOR(S) : Takehisa Yahiro It is certified that error appears in the above-identified patent and that said Letters Patent is hereby corrected as shown below:

Column 4,
Lines 31-32, "angle of convergence angle." should be -- angle of convergence. --.

Column 13,
Line 64, "$\mu$m's." should be -- $\mu$m. --.

Column 15,
Line 13, "micro lithography" be -- microlithography --.

Column 16,
Line 46, "charted" should be -- charged --.

Signed and Sealed this

Twenty-sixth Day of April, 2005

JON W. DUDAS
*Director of the United States Patent and Trademark Office*